United States Patent
Xiong et al.

(10) Patent No.: US 12,211,957 B2
(45) Date of Patent: Jan. 28, 2025

(54) FLIP-CHIP LIGHT-EMITTING DIODE COMPRISING MULTIPLE TRANSPARENT DIELECTRIC LAYERS AND DISTRIBUTED BRAGG REFLECTOR (DBR) STRUCTURE

(71) Applicant: Tianjin Sanan Optoelectronics Co., Ltd., Tianjin (CN)

(72) Inventors: Weiping Xiong, Tianjin (CN); Xin Wang, Tianjin (CN); Zhiwei Wu, Tianjin (CN); Di Gao, Tianjin (CN); Yu-Ren Peng, Tianjin (CN); Huan-shao Kuo, Tianjin (CN)

(73) Assignee: Tianjin Sanan Optoelectronics Co., Ltd., Tianjin (CN)

( * ) Notice: Subject to any disclaimer, the term of this patent is extended or adjusted under 35 U.S.C. 154(b) by 477 days.

(21) Appl. No.: 17/571,218

(22) Filed: Jan. 7, 2022

(65) Prior Publication Data
US 2022/0140203 A1 May 5, 2022

Related U.S. Application Data

(63) Continuation-in-part of application No. PCT/CN2020/078272, filed on Mar. 6, 2020.

(51) Int. Cl.
*H01L 33/46* (2010.01)
*H01L 33/42* (2010.01)
(Continued)

(52) U.S. Cl.
CPC .............. *H01L 33/46* (2013.01); *H01L 33/42* (2013.01); *H01L 33/32* (2013.01); *H01L 33/38* (2013.01); *H01L 33/405* (2013.01)

(58) Field of Classification Search
CPC ....... H01L 33/46; H01L 33/42; H01L 33/405; H01L 33/44
(Continued)

(56) References Cited

U.S. PATENT DOCUMENTS

2010/0308357 A1* 12/2010 Horie ................ H01L 33/44
257/E33.072
2011/0284822 A1* 11/2011 Jung ................ H01L 33/56
257/E33.012
(Continued)

FOREIGN PATENT DOCUMENTS

CN 102460744 A 5/2012
CN 102881811 A 1/2013
(Continued)

OTHER PUBLICATIONS

Search Report issued to PCT application No. PCT/CN2020/078272 on Dec. 4, 2020.
(Continued)

*Primary Examiner* — Didarul A Mazumder
(74) *Attorney, Agent, or Firm* — DLA PIPER LLP (US); Blake W. Jackson

(57) ABSTRACT

A flip-chip light-emitting diode includes a first conductivity type semiconductor layer, a light-emitting layer, a second conductivity type semiconductor layer, a first transparent dielectric layer, a second transparent dielectric layer, and a distributed Bragg reflector (DBR) structure which are sequentially stacked. The first transparent dielectric layer has a thickness greater than $\lambda/2n_1$, and the second transparent dielectric layer has a thickness of $m\lambda/4n_2$, wherein m is an odd number, $\lambda$ is an emission wavelength of the light-emitting layer, $n_1$ is a refractive index of the first transparent dielectric layer, and $n_2$ is a refractive index of the second transparent dielectric layer and is greater than $n_1$.

17 Claims, 4 Drawing Sheets

(51) Int. Cl.
  *H01L 33/32* (2010.01)
  *H01L 33/38* (2010.01)
  *H01L 33/40* (2010.01)

(58) Field of Classification Search
  USPC .................................. 257/211; 438/128, 129
  See application file for complete search history.

(56) References Cited

U.S. PATENT DOCUMENTS

2015/0349207 A1* 12/2015 Sogo .................. H01L 33/0093
                                                          438/33
2017/0248280 A1*  8/2017 Ichikawa ................ G02B 6/00

FOREIGN PATENT DOCUMENTS

| CN | 105938862 A | 9/2016 |
| CN | 206610823 U | 11/2017 |
| CN | 110050512 A | 7/2019 |

OTHER PUBLICATIONS

Search Report appended to an Office Action, which was issued to Chinese counterpart Application No. 2020800029728 by the CNIPAO on Apr. 20, 2022 with an English translation thereof.

* cited by examiner

FLIP-CHIP LIGHT-EMITTING DIODE COMPRISING MULTIPLE TRANSPARENT DIELECTRIC LAYERS AND DISTRIBUTED BRAGG REFLECTOR (DBR) STRUCTURE

CROSS-REFERENCE TO RELATED APPLICATION

This application is a bypass continuation-in-part application of PCT International Application No. PCT/CN2020/078272 filed on Mar. 6, 2020. The entire content of the international patent application is incorporated herein by reference.

FIELD

The disclosure relates to a semiconductor optoelectronic device, and more particularly to a flip-chip light-emitting diode.

BACKGROUND

In a manufacturing process of a conventional flip-chip light-emitting diode (LED), an insulating layer having a certain thickness is formed on a surface of a semiconductor light-emitting stack using plasma enhanced chemical vapor deposition (PECVD), followed by forming a distributed Bragg reflector (DBR) structure having a high refractive index dielectric layer and a low refractive index dielectric layer on the insulating layer using electron beam evaporation or magnetron sputtering. A gap is easily formed on a corner of a platform of the semiconductor light-emitting stack when electron beam evaporation or the magnetron sputtering is used only to form the DBR structure. Since the technique of PECVD can provide a deposition layer with a good covering capability, the DBR structure might be deposited using PECVD to fully cover the platform of the semiconductor light-emitting stack so as to avoid the formation of such gap and to prevent short-circuit caused by a solder paste being in contact with a semiconductor material during packaging. However, the DBR structure formed only by PECVD might not be an ideal structure due to a lower reflectance and a narrower range of reflective wavelength, which might be attributed to the smaller difference between a refractive index of the silicon oxide ($SiO_2$, 1.45) and a refractive index of the silicon nitride ($SiN_x$, 1.96), which are common materials used in PECVD. Therefore, by sequentially forming the insulating layer using PECVD and the DBR structure using electron beam evaporation or magnetron sputtering, the platform of the semiconductor light-emitting stack might be fully covered by the insulating layer and the reflectance of the DBR structure might be increased. In the abovementioned manufacturing process of the flip-chip LED, since a film formed by PECVD needs to have a certain thickness, a variation in the thickness of the film might be greater than $\lambda/4n_0$ ($\lambda$: an emission wavelength of the film; $n_0$: a refractive index of the film), resulting in a large variation in the reflectance of the flip-chip LED. For example, referring to FIG. 1, a reflectance variation of a dielectric layer (e.g., a first transparent dielectric layer) formed by PECVD might be decreased to about 10% at an emission wavelength of 620 nm, as the thickness of the dielectric layer increases from 1.9 μm to 2.0 μm.

The flip-chip LED might have another shortcoming. Specifically, two spaced-apart electrodes are formed on the DBR structure, and are located at two opposite sides of the flip-chip LED, such that a portion of the DBR structure is in contact with the electrodes, and the remaining portion of the DBR structure is in contact with air, resulting in different reflectance of light transmitting to an interface between the electrodes and the DBR structure, and an interface between the air and the DBR structure. For example, referring to FIG. 2, when an outermost layer of the DBR structure in contact with the air is made of a material with a relatively high refractive index, the reflectance of light (i.e., at an emission wavelength of about 620 nm) transmitted to the interface between the electrodes and the DBR structure is lower than that of light transmitted to the interface between the air and the DBR structure. Currently, the design of the DBR structure makes it difficult to meet reflectance requirements of the abovementioned two interfaces.

SUMMARY

An object of the disclosure is to provide a flip-chip light-emitting diode which can alleviate or overcome the aforesaid shortcomings of the prior art.

According to the disclosure, a flip-chip light-emitting diode includes a first conductivity type semiconductor layer, a light-emitting layer, a second conductivity type semiconductor layer, a first transparent dielectric layer, a second transparent dielectric layer, a distributed Bragg reflector (DBR) structure, and two electrodes.

The light-emitting layer is disposed on the first conductivity type semiconductor layer.

The second conductivity type semiconductor layer is disposed on the light-emitting layer opposite to the first conductivity type semiconductor layer.

The first transparent dielectric layer is disposed on the second conductivity type semiconductor layer opposite to the light-emitting layer.

The second transparent dielectric layer is disposed between the first transparent dielectric layer and the second conductivity type semiconductor layer.

The DBR structure is disposed on the first transparent dielectric layer opposite to the second transparent dielectric layer.

The two electrodes are disposed on the DBR structure and are spaced apart from each other.

The first transparent dielectric layer has a thickness greater than $\lambda/2n_1$ and the second transparent dielectric layer has a thickness of $m\lambda/4n_2$, wherein m is an odd number, $\lambda$ is an emission wavelength of the light-emitting layer, $n_1$ is a refractive index of the first transparent dielectric layer, and $n_2$ is a refractive index of the second transparent dielectric layer and is greater than $n_1$.

BRIEF DESCRIPTION OF THE DRAWINGS

Other features and advantages of the disclosure will become apparent in the following detailed description of the embodiment(s) with reference to the accompanying drawings, in which.

DETAILED DESCRIPTION

Figure 1:
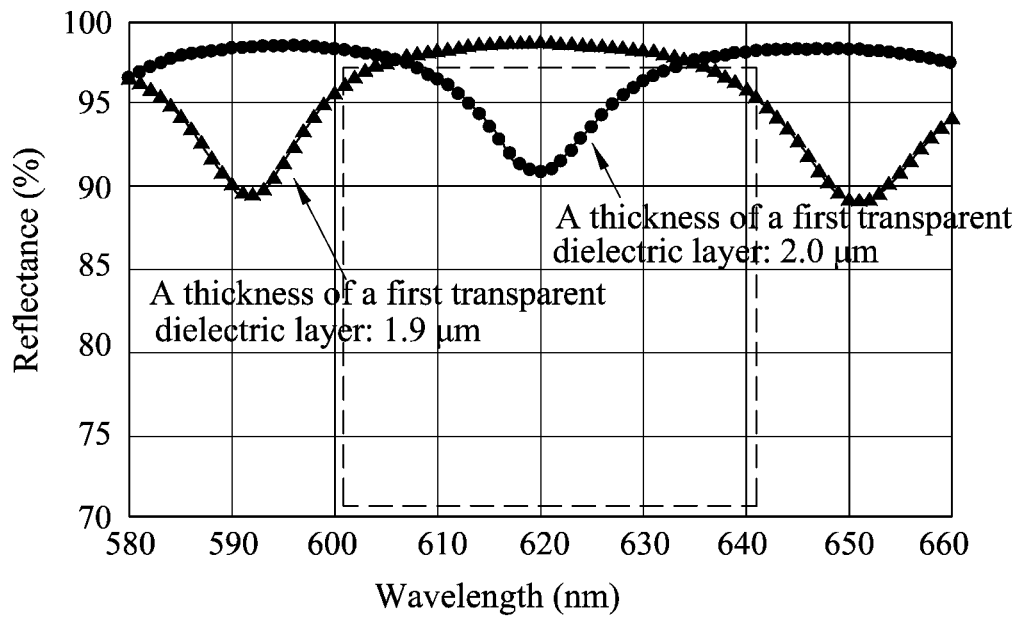
FIG. 1 is a plot showing spectral reflectance curves of a first transparent dielectric layer of a flip-chip light emitting diode (LED) formed by plasma enhanced chemical vapor deposition (PECVD)
Figure 2:
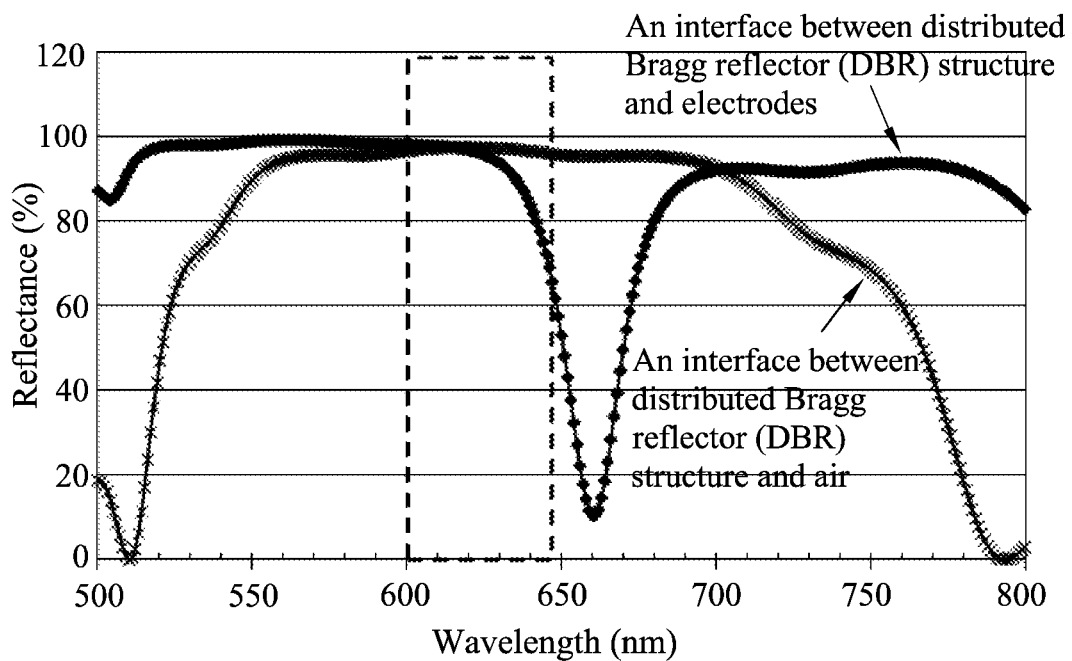
FIG. 2 is a plot showing spectral reflectance curves of an interface between a distributed Bragg reflector (DBR) structure and electrodes, and an interface between the DBR structure and air.

Before the disclosure is described in greater detail, it should be noted that where considered appropriate, reference numerals have been repeated among the figures to indicate corresponding or analogous elements, which may optionally have similar characteristics.

It should be noted that, the formation of a first component over or on a second component in the description below may include embodiments in which the first and second components are formed in direct contact, and may also include embodiments in which additional components may be formed between the first and second components, such that the first and second components may not be in direct contact.

Figure 3:
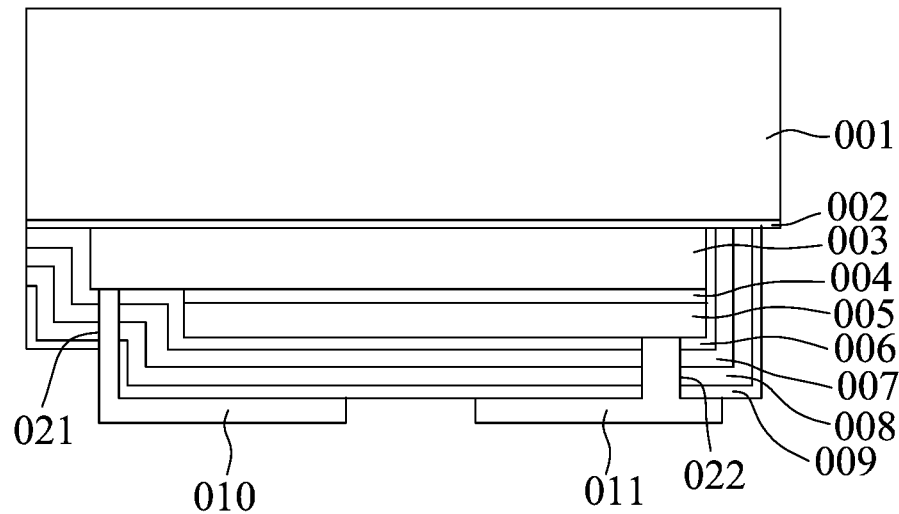
FIG. 3 is a schematic view of a first embodiment of a flip-chip light-emitting diode (LED) according to the disclosure.

Referring to FIG. 3, a first embodiment of a flip-chip light-emitting diode (LED) according to the present disclosure includes a transparent substrate 001, a transparent bonding layer 002, a first conductivity type semiconductor layer 003, a light-emitting layer 004, a second conductivity type semiconductor layer 005, a first transparent dielectric layer 007, a second transparent dielectric layer 006, a distributed Bragg reflector (DBR) structure 008, a third transparent dielectric layer 009, and two electrodes 010, 011.

The transparent substrate 001 may be made of a material selected from the group consisting of sapphire, glass, gallium phosphide (GaP), or combinations thereof. In this embodiment, the transparent substrate 001 is made of sapphire. The transparent substrate 001 may have a thickness ranging from 30 μm to 100 μm. Each of top and bottom surfaces of the transparent substrate 001 may be a roughened surface or a flat surface.

The transparent bonding layer 002 is disposed between the transparent substrate 001 and the first conductivity type semiconductor layer 003, and is used to bond the transparent substrate 001 to the first conductivity type semiconductor layer 003. The transparent bonding layer 002 may be made of silicon oxide ($SiO_2$), and may have a thickness ranging from 1 μm to 5 μm. In some embodiments, the transparent bonding layer 002 may be deposited on a surface of the first conductivity type semiconductor layer 003 using electron beam evaporation. When the surface of the transparent substrate 001 is flat, the transparent bonding layer 002 may be optionally deposited on a surface of the transparent substrate 001; in contrast, when the surface of the transparent substrate 001 is roughened, the deposition of the transparent bonding layer 002 thereon is required. The transparent bonding layer 002 may be subjected to a polishing treatment, so as to have a roughness lower than 1 nm. The polished transparent bonding layer 002 on a surface of the first conductivity type semiconductor layer 003 may be subjected to an activation treatment followed by bonding to the transparent substrate 001 or a polished and activated transparent bonding layer of the transparent substrate 001. The bonding between the polished transparent bonding layer 002 and the transparent substrate 001 may be formed at a high temperature and a high pressure.

The first conductivity type semiconductor layer 003 is disposed on the transparent bonding layer 002 opposite to the transparent substrate 001. The light-emitting layer 004 is disposed on the first conductivity type semiconductor layer 003 opposite to the transparent bonding layer 002. The second conductivity type semiconductor layer 005 is disposed on the light-emitting layer 004 opposite to the first conductivity type semiconductor layer 003. In this embodiment, the first conductivity type semiconductor layer 003 is made of GaP, the light-emitting layer 004 has an emission wavelength (λ) of 630 nm, and the second conductivity type semiconductor layer 005 is made of aluminum gallium indium phosphide (AlGaInP).

In this embodiment, portions of the light-emitting layer 004 and the second conductivity type semiconductor layer 005 are etched, such that a portion of the first conductivity type semiconductor layer 003 is exposed from the light-emitting layer 004 and the second conductivity type semiconductor layer 005, and is electrically connected to the electrode 010 as described hereinafter.

The first transparent dielectric layer 007 is disposed on the second conductivity type semiconductor layer 005 opposite to the light-emitting layer 004. The first transparent dielectric layer 007 may be formed using plasma enhanced chemical vapor deposition (PECVD). The first transparent dielectric layer 007 may be made of $SiO_2$, silicon oxynitride ($SiN_xO_y$), or a combination thereof. In this embodiment, the first transparent dielectric layer 007 is made of $SiO_2$, and the refractive index of the first transparent dielectric layer 007 is 1.45. The first transparent dielectric layer 007 may have a thickness greater than $\lambda/2n_1$, wherein $n_1$ is a refractive index of the first transparent dielectric layer 007. In this embodiment, the first transparent dielectric layer 007 may have a thickness ranging from 1.8 μm to 2.2 μm.

The second transparent dielectric layer 006 is disposed between the first transparent dielectric layer 007 and the second conductivity type semiconductor layer 005. The second transparent dielectric layer 006 may be deposited on the second conductivity type semiconductor layer 005 using PECVD. The second transparent dielectric layer 006 may be made of silicon nitride ($SiN_x$), titanium dioxide ($TiO_2$), tantalum pentoxide ($Ta_2O_5$), or combinations thereof. The second transparent dielectric layer 006 may have a thickness of $m\lambda/4n_2$, wherein m is an odd number, $n_2$ is a refractive index of the second transparent dielectric layer 006, and $n_2$ is greater than $n_1$ (the refractive index of the first transparent dielectric layer 007). In this embodiment, the second transparent dielectric layer 006 is made of $SiN_x$, the refractive index of the second transparent dielectric layer 006 is 1.96, and the thickness of the second transparent dielectric layer 006 is 78 nm. The refractive index $n_2$ (e.g., 1.96) of the second transparent dielectric layer 006 may be greater than that of the first transparent dielectric layer 007 (e.g., 1.45), and lower than that of the second conductivity type semiconductor layer 005 (e.g., 3.29). In some embodiments, each of the first transparent dielectric layer 007 and the second transparent dielectric layer 006 may have a density greater than that of the DBR structure 008.

Since the thickness of the first transparent dielectric layer 007 is relatively large, a variation in the thickness of the first transparent dielectric layer 007 may range from −10% to 10% according to production control standard. Such variation in the thickness of the first transparent dielectric layer 007 may be about 200 nm, which is greater than $\lambda/4n_1$ (108 nm in this embodiment), and adversely affects the reflectance of the DBR structure 008 as described hereinafter and production stability of the flip-chip LEDs.

The DBR structure 008 is disposed on the first transparent dielectric layer 007 opposite to the second transparent dielectric layer 006. The DBR structure 008 may be deposited on the first transparent dielectric layer 007 using plasma-assisted electron beam evaporation or magnetron sputtering. The DBR structure 008 includes plural sets of a first light-transmissive layer and a second light-transmissive layer stacked on each other (not shown), and a refractive index of the first light-transmissive layer is greater than that of the second light-transmissive layer. The first light-transmissive layer may be made of $TiO_2$, $Ta_2O_5$, or a combination thereof. The second light-transmissive layer may be made of $SiO_2$, magnesium fluoride ($MgF_2$), aluminum oxide ($Al_2O_3$), or combinations thereof. A total set number of the first light-transmissive layer and the second light-transmissive layer may range from 3 to 10. In this embodiment, the first light-transmissive layer is made of $TiO_2$ and has a thickness of 68 nm, the second light-transmissive layer is made of $SiO_2$ and has a thickness of 108 nm, and the total set number of the first light-transmissive layer and the second light-transmissive layer is 5. In some embodiments, the DBR structure 008 includes a contact layer (not shown) in contact with the first transparent dielectric layer 007, and the contact layer has a refractive index greater than that of the first transparent dielectric layer 007 and is made of $TiO_2$, $Ta_2O_5$, or a combination thereof. In this embodiment, the contact layer of the DBR structure 008 in contact with the first transparent dielectric layer 007 is made of $TiO_2$, and has a thickness of $\lambda/4n_0$ ($n_c$: a refractive index of the contact layer).

Figure 4:
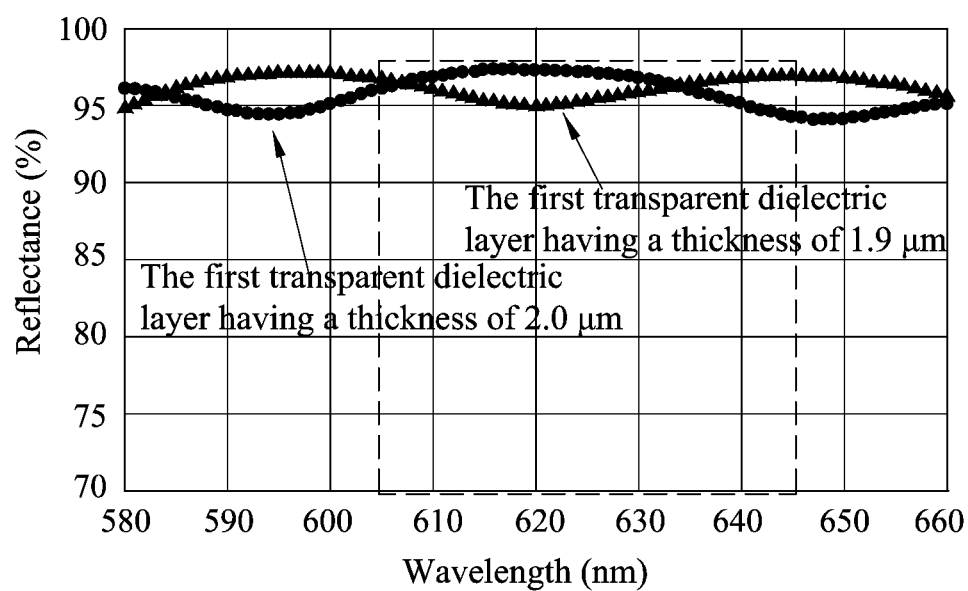
FIG. 4 is a plot showing spectral reflectance curves of a first transparent dielectric layer having thickness of 1.9 μm and 2.0 μm in the first embodiment, in which a second transparent dielectric layer is disposed between the first transparent dielectric layer and a second conductivity type semiconductor layer.

In this embodiment, by having the second transparent dielectric layer 006, the first transparent dielectric layer 007, the second transparent dielectric layer 006, and the second conductivity type semiconductor layer 005 cooperate to form an anti-reflective coating structure, such that a light emitted from the light-emitting layer 004 is directed out of the first transparent dielectric layer 007, and enters into the DBR structure 008, preventing the reflectance of the DBR structure 008 from being adversely affected by the variation in the thickness of the first transparent dielectric layer 007, as shown in FIG. 4. The second transparent dielectric layer 006 fully covers the second conductivity type semiconductor layer 005, the light-emitting layer 004, and the first conductivity type semiconductor layer 003. The first transparent dielectric layer 007 covers the second transparent dielectric layer 006, to thereby insulate the first conductivity type semiconductor layer 003, the light-emitting layer 004, and the second conductivity type semiconductor layer 005. In such case, after etching, exposed sidewalls of the second conductivity type semiconductor layer 005 and the light-emitting layer 004 are also covered by the second transparent dielectric layer 006.

The third transparent dielectric layer 009 is disposed on the DBR structure 008 opposite to the first transparent dielectric layer 007. The third transparent dielectric layer 009 may be formed using plasma-assisted electron beam evaporation or magnetron sputtering. The third transparent dielectric layer 009 has a refractive index greater than that of a distal layer of the DBR structure 008 in contact with the third transparent dielectric layer 009 and distal from the first transparent dielectric layer 007. The distal layer of the DBR structure 008 in contact with the third transparent dielectric layer 009 may be made of $SiO_2$. The third transparent dielectric layer 009 is made of $SiN_x$, $TiO_2$, $Ta_2O_5$, or combinations thereof. The third transparent dielectric layer 009 may have a thickness ranging from $k\lambda/4n_3$ to $(k+1)\lambda/4n_3$, wherein $n_3$ is a refractive index of the third transparent dielectric layer 009, and k is an odd number. In this embodiment, the third transparent dielectric layer 009 is made of $TiO_2$, has a refractive index of 2.28, and has a thickness of 95 nm. Another contact layer (i.e., the distal layer) of the DBR structure 008 in contact with the third transparent dielectric layer 009 is $SiO_2$.

Figure 5:
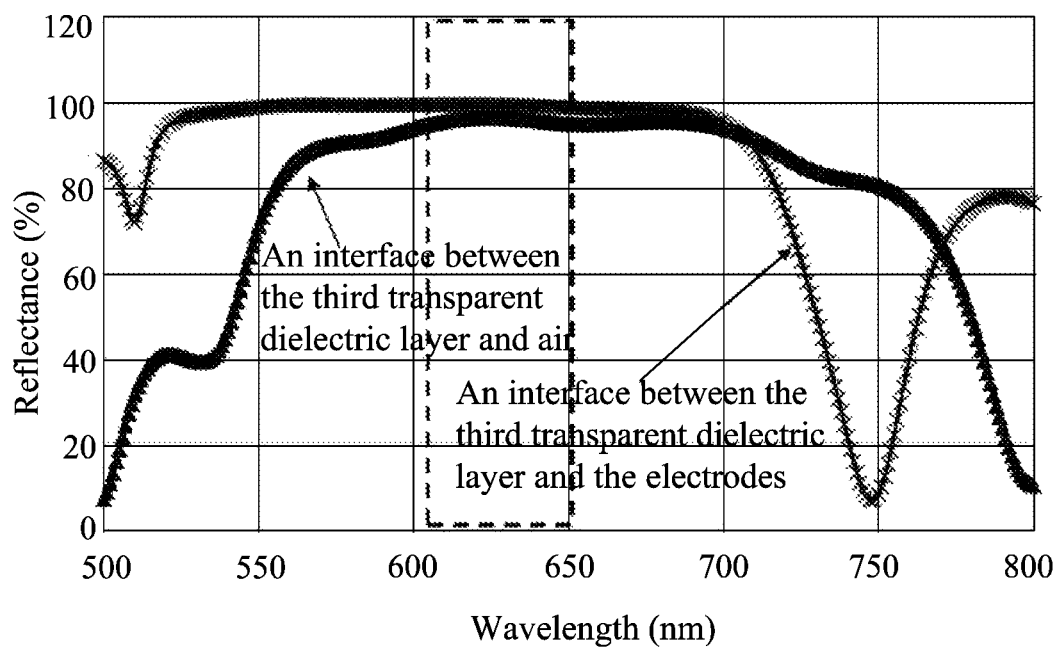
FIG. 5 is a plot showing spectral reflectance curves of an interface between a third transparent dielectric layer and the electrodes, and an interface between the third transparent dielectric layer and air in the first embodiment, in which the third transparent dielectric layer is disposed on the DBR structure opposite to the first transparent dielectric layer.

With the third transparent dielectric layer 009 having the refractive index greater than that of the air, a light directed out of the DBR structure 008 and transmitted to an interface between the third transparent dielectric layer 009 and the air may be effectively reflected. Since the refractive index of the distal layer of the DBR structure 008 in contact with the third transparent dielectric layer 009 is lower than that of the third transparent dielectric layer 009, such distal layer of the DBR structure 008, the third transparent dielectric layer 009, and the electrodes 010, 011 in contact with the third transparent dielectric layer 009 may cooperate to form an anti-reflective coating structure, which will adversely affect reflection of light at the electrodes 010, 011. In order to avoid formation of the abovementioned anti-reflective coating structure, the thickness of the third transparent dielectric layer 009 may be increased (e.g., greater than $\lambda/4n_3$), thereby increasing reflection of light transmitted to the electrodes 010, 011, and the interface between the third transparent dielectric layer 009 and the air, as shown in FIG. 5.

The electrodes 010, 011 are disposed on the DBR structure 008, and are spaced apart from each other. In this embodiment, the flip-chip light-emitting diode may further include two through holes 021, 022 that are spaced apart from each other, and that penetrate through the third transparent dielectric layer 009, the DBR structure 008, the first transparent dielectric layer 007 and the second transparent dielectric layer 006 to terminate at the first conductivity type semiconductor layer 003 and the second conductivity type semiconductor layer 005, respectively. The electrodes 010, 011 are electrically connected to the first conductivity type semiconductor layer 003 and the second conductivity type semiconductor layer 005 through the through holes 021, 022, respectively. The through holes 021, 022 may be formed using well-known techniques such as photolithography and dry etching. Each of the electrodes 010, 011 may be formed as a multi-layered metal structure. In some embodiments, each of the electrodes 010, 011 may have a contact layer that is in contact with the third transparent dielectric layer 009 and that is made of aluminum (Al), gold (Au), platinum (Pt), silver (Ag), or combinations thereof. A surface of the contact layer of the electrodes 010, 011 is in contact with the DBR structure 008, and acts as a reflector.

Figure 6:
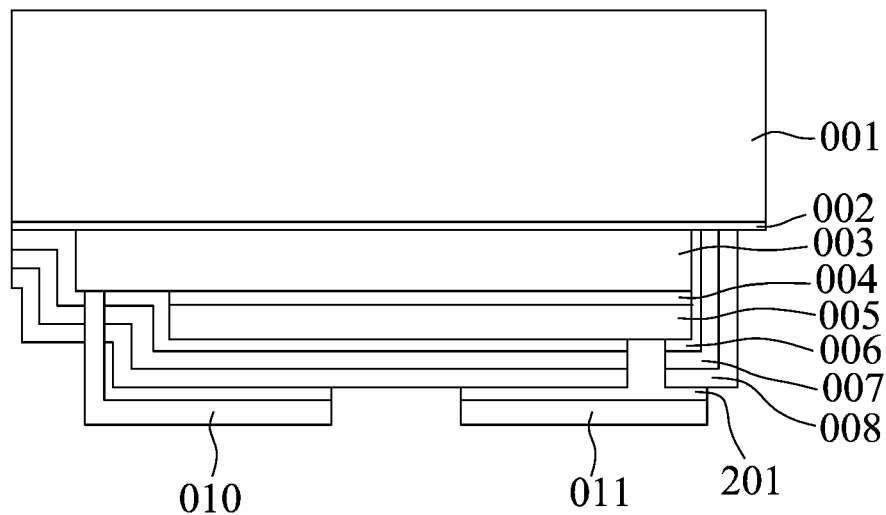
FIG. 6 is a schematic view of a second embodiment of the flip-chip LED according to the disclosure.

Referring to FIG. 6, a second embodiment of the flip-chip LED according to the present disclosure is generally similar to the first embodiment, except for the following differences.

First, in the second embodiment, a distal layer of the DBR structure 008 distal from the first transparent dielectric layer 007 is made of $TiO_2$ having a high refractive index.

In addition, the flip-chip LED further includes a transparent conducting layer 201 which is disposed between the electrodes 010, 011 and the DBR structure 008 and which has a refractive index lower than that of the distal layer of the DBR structure 008 distal from the first transparent dielectric layer 007 and in contact with the transparent conducting layer 201. The transparent conducting layer 201 may be made of indium zinc oxide (IZO), indium tin oxide (ITO), aluminum zinc oxide (AZO) or combinations thereof, and may be formed by evaporation. The transparent conducting layer 201 may have a thickness of $k\lambda/4n$, wherein n is a refractive index of the transparent conducting layer 201 and k is an odd number. In this embodiment, the refractive index of the transparent conducting layer 201 is 2.0, and the thickness of the transparent conducting layer 201 is 79 nm. In addition, as described above in the first embodiment, each of the electrodes 010, 011 may be formed as a multi-layered metal structure. In the second embodiment, each of the electrodes 010, 011 may have a contact layer that is in contact with the transparent conducting layer 201 and that is made of Al, Au, Pt, Ag, or combinations thereof, so as to act as a reflector.

The distal layer of the DBR structure 008, the transparent conducting layer 201, and the electrodes 010, 011 cooperate to form a reflector structure having a high reflectance.

Figure 7:
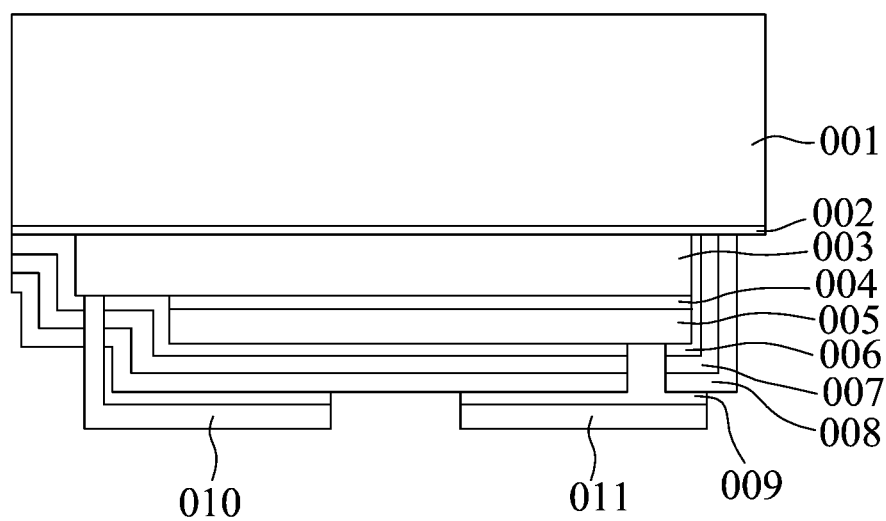
FIG. 7 is a schematic view of a third embodiment of the flip-chip LED according to the disclosure.

Referring to FIG. 7, a third embodiment of the flip-chip LED according to the present disclosure is generally similar to the first embodiment, except for the following differences.

First, in the third embodiment, the third transparent dielectric layer 009 has a refractive index lower than that of a distal layer (i.e., the contact layer) of the DBR structure 008 in contact with the third transparent dielectric layer 009 and distal from the first transparent dielectric layer 007. The third transparent dielectric layer 009 may be made of $SiO_2$, $MgF_2$, $Al_2O_3$, and combinations thereof. In this embodiment, the third transparent dielectric layer 009 is made of $SiO_2$, has a refractive index of 1.45, and has a thickness of $\lambda/4n_3$ (108 nm in this embodiment).

Second, a contact layer (not shown) of the DBR structure 008 in contact with the third transparent dielectric layer 009 is made of $TiO_2$. Such contact layer of the DBR structure 008 is formed by evaporation at a high temperature of at least 300° C., followed by annealing for a time period ranging from 350 seconds to 500 seconds, so as to provide the contact layer (not shown) of the DBR structure 008 with an etching selectivity with respect to the third transparent dielectric layer 009.

The third transparent dielectric layer 009 is disposed between the electrodes 010, 011 and the DBR structure 008. The formation of the third transparent dielectric layer 009 may involve depositing a transparent dielectric layer on the DBR structure 008, forming the electrodes 010, 011, and then etching the transparent dielectric layer through the electrodes 010, 011 that serve as masks to expose the DBR structure 008, so as to form the third transparent dielectric layer 009.

The DBR structure of the conventional flip-chip LED has fewer pairs of the first light-transmissive layer and the second light-transmissive layer stacked on each other, such that the spectral reflectance of the flip-chip LED might be adversely affected by a variation in the thickness of each layer of the flip-chip LED. Compared with the conventional flip-chip LED, the flip-chip LED of the present disclosure has the following advantages:

1. The first and second transparent dielectric layers can fully cover the second conductivity type semiconductor layer, the light-emitting layer, and the first conductivity type semiconductor layer, so as to prevent short-circuit caused by a solder paste being in contact with a semiconductor material of the flip-chip LED during packaging.

2. With the second transparent dielectric layer, the first transparent dielectric layer, the second transparent dielectric layer, and the second conductivity type semiconductor layer cooperate to form an anti-reflective coating structure, such that a light emitted from the light-emitting layer is directed out of the first transparent dielectric layer, and enters into the DBR structure, so as to prevent the reflectance of the flip-chip LED from being adversely affected by the variation in the thickness of the first transparent dielectric layer, thereby enlarging a process window for the flip-chip LED, and being conducive for providing stability of mass production of the flip-chip LED.

3. By increasing the thickness of the third transparent dielectric layer (e.g., greater than $\lambda/4n_3$), the anti-reflective coating structure formed by the third transparent dielectric layer and the electrodes may be avoided, such that a light emitted from the light-emitting layer can be effectively reflected when transmitting to the electrodes and an interface between the DBR structure and the air.

4. With the transparent conducting layer disposed between the electrodes and the distal layer of the DBR structure distal from the first transparent dielectric layer, the distal layer of the DBR structure, the transparent conducting layer, and the electrodes cooperate to form a reflector structure without affecting reflection of a light transmitted to the interface the DBR structure and the air.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A flip-chip light-emitting diode, comprising:
a first conductivity type semiconductor layer;
a light-emitting layer disposed on said first conductivity type semiconductor layer;
a second conductivity type semiconductor layer disposed on said light-emitting layer opposite to said first conductivity type semiconductor layer;
a first transparent dielectric layer disposed on said second conductivity type semiconductor layer opposite to said light-emitting layer;
a second transparent dielectric layer disposed between said first transparent dielectric layer and said second conductivity type semiconductor layer;
a distributed Bragg reflector (DBR) structure disposed on said first transparent dielectric layer opposite to said second transparent dielectric layer; and two electrodes disposed on said DBR structure and spaced apart from each other,
said first transparent dielectric layer having a thickness greater than $\lambda/2n_1$, and said second transparent dielectric layer having a thickness of $m\lambda/4n_2$,
wherein
m is an odd number,
$\lambda$ is an emission wavelength of said light-emitting layer,
$n_1$ is a refractive index of said first transparent dielectric layer, and
$n_2$ is a refractive index of said second transparent dielectric layer and is greater than $n_1$, and
wherein said flip-chip light-emitting diode further comprises a third transparent dielectric layer disposed on said DBR structure opposite to said first transparent dielectric layer, said third transparent dielectric layer having a refractive index greater than that of a distal layer of said DBR structure in contact with said third transparent dielectric layer and distal from said first transparent dielectric layer.

2. The flip-chip light-emitting diode of claim 1, wherein a portion of said first conductivity type semiconductor layer is exposed from said light-emitting layer and said second conductivity type semiconductor layer; said second transparent dielectric layer fully covers said second conductivity type semiconductor layer, said light-emitting layer, and said first conductivity type semiconductor layer; and said first transparent dielectric layer covers said second transparent dielectric layer.

3. The flip-chip light-emitting diode of claim 1, wherein said first transparent dielectric layer is made of a material selected from the group consisting of silicon dioxide ($SiO_2$), silicon oxynitride ($SiN_xO_y$), and a combination thereof.

4. The flip-chip light-emitting diode of claim 1, wherein $n_2$ is lower than a refractive index of said second conductivity type semiconductor layer.

5. The flip-chip light-emitting diode of claim 1, wherein said second transparent dielectric layer is made of a material selected from the group consisting of silicon nitride ($SiN_x$), titanium dioxide ($TiO_2$), tantalum pentoxide ($Ta_2O_5$), and combinations thereof.

6. The flip-chip light-emitting diode of claim 1, wherein each of said first transparent dielectric layer and said second transparent dielectric layer has a density greater than that of said DBR structure.

7. The flip-chip light-emitting diode of claim 1, further comprising two through holes that are spaced apart from each other, and that penetrate through said DBR structure, said first transparent dielectric layer and said second transparent dielectric layer to terminate at said first conductivity type semiconductor layer and said second conductivity type semiconductor layer, respectively, said two electrodes being electrically connected to said first conductivity type semiconductor layer and said second conductivity type semiconductor layer through said two through holes, respectively.

8. The flip-chip light-emitting diode of claim 1, wherein said DBR structure includes plural sets of a first light-transmissive layer and a second light-transmissive layer stacked on each other, a refractive index of said plural sets of the first light-transmissive layer being greater than that of said second light-transmissive layer, said plural sets of the first light-transmissive layer being made of a material selected from the group consisting of $TiO_2$, $Ta_2O_5$, and a combination thereof, said second light-transmissive layer being made of a material selected from the group consisting of $SiO_2$, magnesium fluoride ($MgF_2$), aluminum oxide ($Al_2O_3$), and combinations thereof.

9. The flip-chip light-emitting diode of claim 8, wherein a total set number of said plural sets of the first light-transmissive layer and said second light-transmissive layer ranges from 3 to 10.

10. The flip-chip light-emitting diode of claim 1 wherein said third transparent dielectric layer is made of a material selected from the group consisting of $SiN_x$, $TiO_2$, $Ta_2O_5$, and combinations thereof.

11. The flip-chip light-emitting diode of claim 10, wherein said third transparent dielectric layer has a thickness ranging from $k\lambda/4n_3$ to $(k+1)\lambda/4n_3$, wherein $n_3$ is a refractive index of said third transparent dielectric layer, and k is an odd number.

12. The flip-chip light-emitting diode of claim 1, further comprising a transparent conducting layer disposed between said two electrodes and said DBR structure and having a refractive index lower than that of a distal layer of said DBR structure distal from said first transparent dielectric layer.

13. The flip-chip light-emitting diode of claim 12, wherein said transparent conducting layer is made of a material selected from the group consisting of indium zinc oxide (IZO), indium tin oxide (ITO), aluminum zinc oxide (AZO) and combinations thereof, and has a thickness of $k\lambda/4n$, wherein n is a refractive index of said transparent conducting layer, and k is an odd number.

14. The flip-chip light-emitting diode of claim 1, wherein each of said two electrodes has a surface which is in contact with said DBR structure and which acts as a reflector.

15. A flip-chip light-emitting diode, comprising:
a first conductivity type semiconductor layer;
a light-emitting layer disposed on said first conductivity type semiconductor layer;
a second conductivity type semiconductor layer disposed on said light-emitting layer opposite to said first conductivity type semiconductor layer;
a first transparent dielectric layer disposed on said second conductivity type semiconductor layer opposite to said light-emitting layer;
a second transparent dielectric layer disposed between said first transparent dielectric layer and said second conductivity type semiconductor layer;
a distributed Bragg reflector (DBR) structure disposed on said first transparent dielectric layer opposite to said second transparent dielectric layer; and
two electrodes disposed on said DBR structure and spaced apart from each other, said first transparent dielectric layer having a thickness greater than $\lambda/2n_1$, and said second transparent dielectric layer having a thickness of $m\lambda/4n_2$,
wherein
m is an odd number,
$\lambda$ is an emission wavelength of said light-emitting layer,
$n_1$ is a refractive index of said first transparent dielectric layer, and
$n_2$ is a refractive index of said second transparent dielectric layer and is greater than $n_1$, and
wherein said flip-chip light-emitting diode further comprises a third transparent dielectric layer disposed between said electrodes and said DBR structure and having a refractive index lower than that of a distal layer of said DBR structure in contact with said third transparent dielectric layer and distal from said first transparent dielectric layer.

16. The flip-chip light-emitting diode of claim 15, wherein said third transparent dielectric layer is made of a material selected from the group consisting of $SiO_2$, $MgF_2$, $Al_2O_3$, and combinations thereof.

17. The flip-chip light-emitting diode of claim 15, wherein said third transparent dielectric layer has a thickness of $k\lambda/4n_3$, wherein $n_3$ is a refractive index of said third transparent dielectric layer, and k is an odd number.

* * * * *